United States Patent [19]
Rush

[11] Patent Number: 5,134,403
[45] Date of Patent: Jul. 28, 1992

[54] HIGH SPEED SAMPLING AND DIGITIZING SYSTEM REQUIRING NO HOLD CIRCUIT

[75] Inventor: Kenneth Rush, Colorado Springs, Colo.

[73] Assignee: Hewlett-Packard Co., Palo Alto, Calif.

[21] Appl. No.: 623,139

[22] Filed: Dec. 6, 1990

[51] Int. Cl.$^5$ ............................................. H03M 1/36
[52] U.S. Cl. ..................................... 341/159; 341/122
[58] Field of Search .............. 341/122, 127, 155, 159, 341/133; 307/352, 353, 360, 361; 358/138; 364/178, 179

[56] References Cited

U.S. PATENT DOCUMENTS

| | | | |
|---|---|---|---|
| 3,430,072 | 2/1969 | Stevens | 341/122 X |
| 3,581,305 | 5/1971 | Howlett | 341/122 X |
| 3,820,033 | 6/1974 | Iwata | 341/122 X |
| 4,183,016 | 1/1980 | Sawagata | 341/122 |
| 4,584,559 | 4/1986 | Penney | 341/122 |

OTHER PUBLICATIONS

Hnatek, Eugene R., *A User's Handbook of D/A and A/D Converters*, pp. 369-374, 1976.
"A 1-GHz 6-bit ADC System", Ken Poulton et al., *IEEE Journal of Solid State Circuits*, vol. SC-22, No. 6, Dec. 1987, pp. 962-970.
"A Complete Monolithic Sample/Hold Amplifier", Kenneth R. Stafford et al., *IEEE Journal of Solid State Circuits*, vol. SC-9, No. 6, Dec. 1974, pp. 381-387.

*Primary Examiner*—Sharon D. Logan

[57] ABSTRACT

Disclosed is an analog to digital conversion system that converts high speed analog signals to digital values without using a hold circuit. The system has a narrow aperture sampling circuit that samples an input signal and feeds the sampled signal to a capacitor. A resistor in parallel with the capacitor discharges the capacitor at a predetermined rate, thus the capacitor does not hold the sampled signal. The discharging signal output of the capacitor-resistor circuit is amplified and then filtered using a low-pass filter, which has essentially linear phase shift and no undershoot. The filtered signal is then amplified and fed to a flash analog to digital converter which converts the signal into a digital value. The low-pass filter creates a Gaussian output and the converter is timed to convert the signal at the peak of the filter output.

22 Claims, 10 Drawing Sheets

HIGH SPEED SAMPLING AND DIGITIZING SYSTEM REQUIRING NO HOLD CIRCUIT

FIELD OF THE INVENTION

This invention relates to electronic circuits and more particularly to converting analog electronic signals into digital values. Even more particularly, the invention relates to high speed sampling and conversion of an analog signal without the use of a hold circuit.

BACKGROUND OF THE INVENTION

In current systems that perform analog to digital conversion of high speed electrical signals, that is signals in the 1GHz range, the input signal is sampled and then held, using an analog storage device, to provide time for the conversion to be performed. Some prior art circuits use a track and hold circuit in place of the sample and hold circuit.

When a track and hold circuit is used, the bandwidth of the circuit following the track and hold circuit must be approximately twice the sample rate. In sample and hold circuits the bandwidth needed is approximately equal to the sample rate. Since the noise being filtered by the circuit is dependent upon the bandwidth, reducing the bandwidth will reduce the noise and provide for an easier design.

In either sample and hold or track and hold circuits, the analog holding component is usually a capacitor. The hold time is therefore dependent upon the impedance in parallel with the capacitor and the size of the capacitor. A large capacitor is difficult to construct on an integrated circuit, and a large capacitor is difficult to charge quickly enough to provide a high speed sampler. Therefore, the goal of a high speed sampler circuit is to minimize the value of the hold capacitor. The impedance in parallel with the capacitor is primarily determined by the input impedance of the circuit following the capacitor, which means that this circuit must have a high impedance in order to provide an adequate hold time for the signal. Because of the hold requirements, and the associated need for a high impedance connecting circuit, bi-polar technology cannot be used in the circuit following the hold component. This is a significant limitation in prior art circuits. A further discussion of this problem can be found in "A Complete Monolithic Sample/Hold Amplifier", Kenneth R. Stafford, et al., *IEEE Journal of Solid State Circuits*. Vol. SC-9, No. 6, December 1974, pp.381-387.

An example of a prior art converter can be found in "A 1-GHz 6-bit ADC System", Ken Poulton, John J. Corcoran, and Thomas Hornak, *IEEE Journal of Solid-State Circuits*, Vol. SC-22, No. 6, December 1987, pp. 962-970.

There is a need in the art then for a high speed analog to digital conversion system that performs the conversion without using a hold circuit. There is a another need for such a system that provides a better noise filtering by reducing the bandwidth requirements of the circuit that follows the sampler. Still another need is for such a system that does not require circuits following the sampling circuit to have a high impedance input. The present invention meets these needs.

SUMMARY OF THE INVENTION

It is an aspect of the present invention to convert a high speed analog signal into a digital value.

It is another aspect of the invention to perform such conversion without using a hold circuit.

Another aspect of the invention is to provide better noise reduction than prior art techniques which use sample and hold or track and hold circuits.

Another aspect is to provide such conversion using a lower bandwidth circuit.

A further aspect of the invention is to perform such conversion in a circuit that lowers the input impedance requirement for the circuits following the sampler.

The above and other objects of the invention are accomplished in a system having a narrow aperture sampling circuit that samples an input signal. The sampled signal is used to charge a capacitor, and a resistor in parallel with the capacitor discharges the capacitor at a predetermined rate. The discharging signal is amplified and then filtered using a Gaussian magnitude low-pass filter, which has essentially linear phase shift and no undershoot. The filtered signal is then amplified and fed to a flash analog to digital converter which converts the signal into a digital value. The low-pass filter creates a Gaussian output and the converter is timed to convert the signal at the peak of the filter output.

Because the signal is not held by the capacitor, but is instead discharged by the parallel resistor at a rate higher than the sample period, the circuit following the capacitor-resistor need not have a high impedance input. Thus, the following circuit may be of bi-polar transistor design. Also, the amplifiers may not be needed, depending upon the type of filter used and the type of analog to digital converter used.

BRIEF DESCRIPTION OF THE DRAWINGS

The above and other objects, features, and advantages of the invention will be better understood by reading the following more particular description of the invention, presented in conjunction with the following drawings, wherein.

DESCRIPTION OF THE PREFERRED EMBODIMENT

The following description is of the best presently contemplated mode of carrying out the present invention. This description is not to be taken in a limiting sense but is made merely for the purpose of describing the general principles of the invention. The scope of the invention should be determined by referencing the appended claims.

Figure 1:
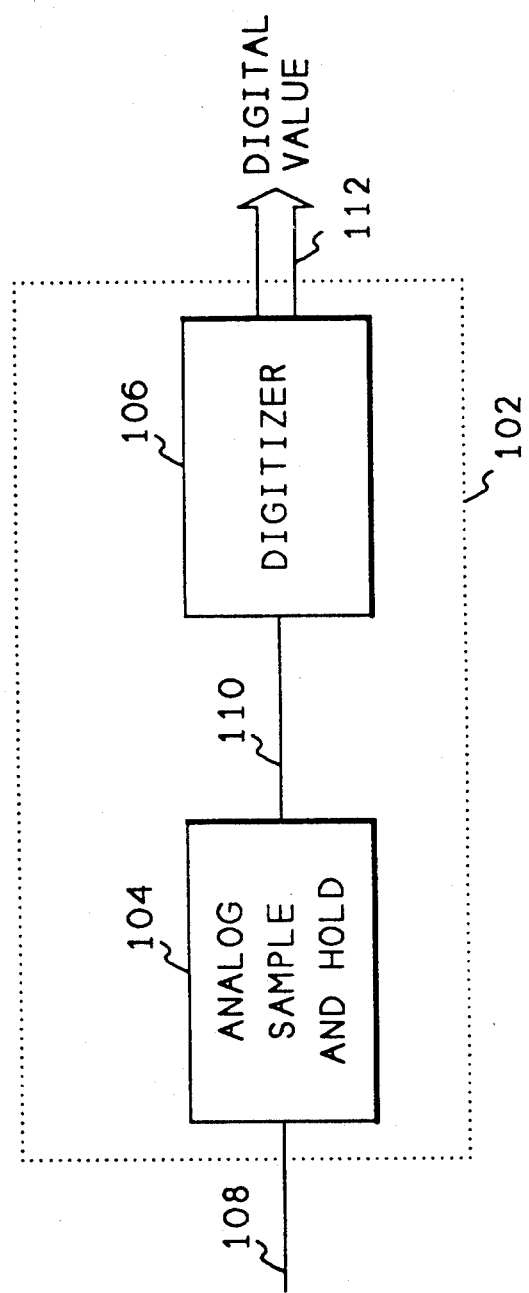
FIG. 1 shows a block diagram of a prior art analog to digital converter using a hold circuit.

FIG. 1 shows a block diagram of a prior art digital-to-analog converter which uses a sample and hold circuit. Referring now to FIG. 1, a converter circuit 102 contains an analog sample and hold circuit 104 and a digitizer 106. An input signal is received on line 108, sampled and held by the sample and hold circuit 104, and the sample is fed to the digitizer 106 through line 110. After the sample is digitized by the digitizer 106, the digital value is output on bus 112. Some prior art circuits use a track and hold circuit in place of the sample and hold circuit 104. In prior art circuits the signal must be held, typically by a very small capacitor, in order to provide the time necessary to perform the analog to digital conversion. Even flash analog-to-digital converters, the fastest known in the art, are not fast enough to convert a signal having a frequency of 1 GHz without using a hold circuit.

Figure 2:
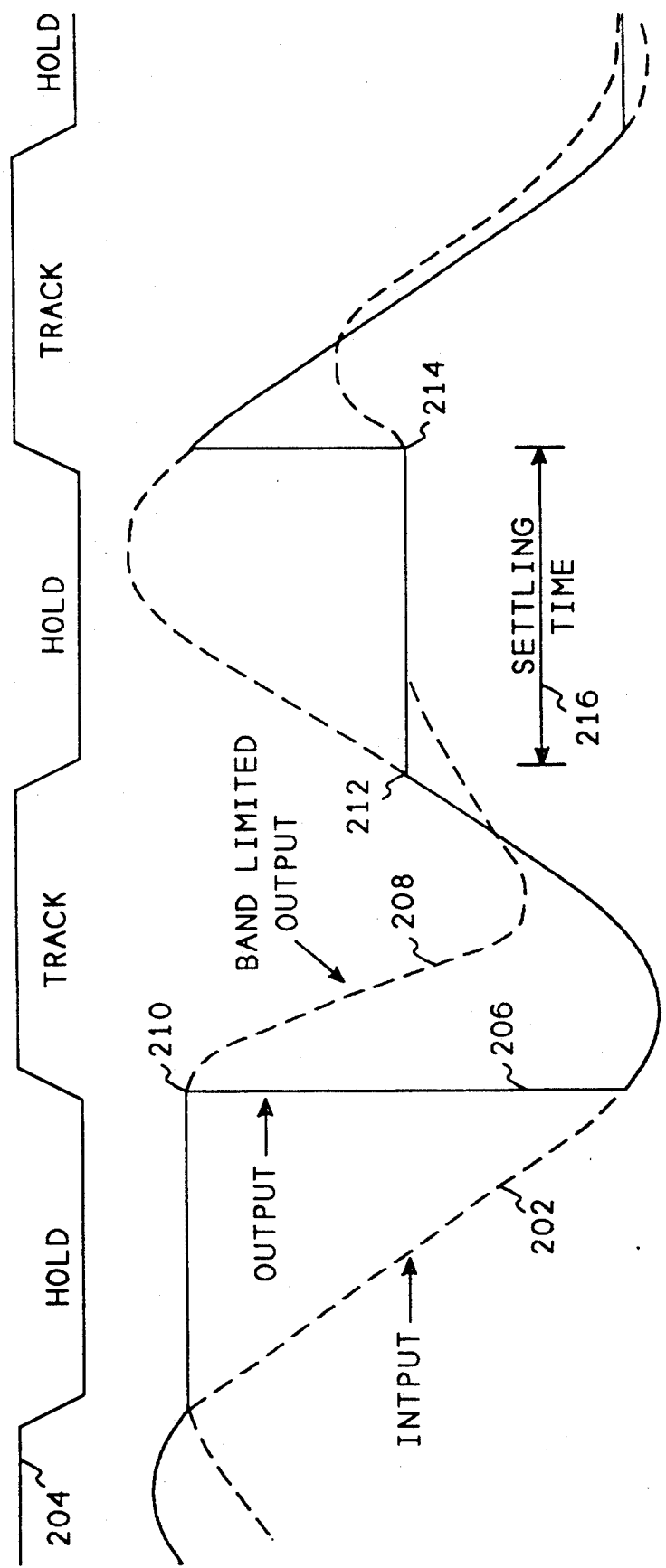
FIG. 2 shows waveforms from a prior art track and hold circuit.

FIG. 2 shows the waveforms from a prior art track and hold circuit. Referring now to FIG. 2, a sinusoidal input signal 202 being input to a track and hold circuit. The waveform 204 shows the track and hold gate input to the circuit, and illustrates the hold times versus the track times. Waveform 206 shows the theoretical, infinite bandwidth, output of the track and hold circuit, and shows that when the circuit switches from track to hold, for example at location 210, the output of the theoretical track and hold circuit instantly acquires the input voltage. For this idealized output to occur, the bandwidth of the track and hold circuit would have to be infinite. Waveform 208 shows the band-limited output of a practical track and hold circuit. When the practical track and hold circuit switches from hold to track, for example at location 210, the band-limited output attempts to go to the input voltage. However, because of the bandwidth limitations, a certain amount of settling time occurs prior to the output reaching the input voltage. When the circuit switches to hold mode, for example at location 212, the output of the track and hold circuit starts to settle out to its final value at location 214. The settling time of such a practical track and hold circuit, as indicated by arrow 216, is a function of the bandwidth of the circuit, and is approximately equal to one divided by twice the sampling rate.

Figure 3:
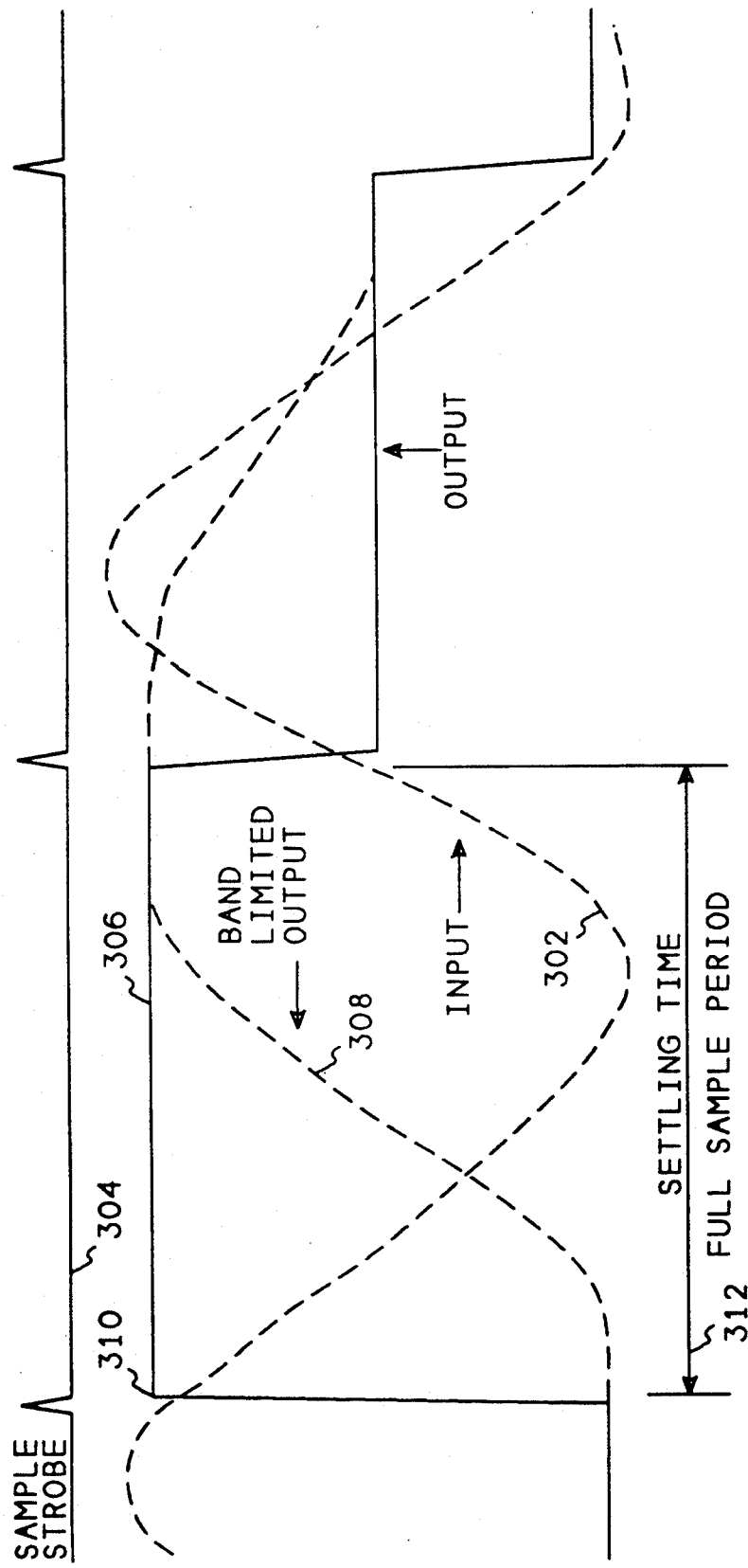
FIG. 3 shows waveforms from a prior art sample and hold circuit.

FIG. 3 shows waveforms from a prior art sample and hold circuit. Referring now to FIG. 3, a sinusoidal input waveform 302 is sampled by sampling strobe 304 at location 310. Waveform 306 shows an ideal infinite bandwidth output of such a sample and hold circuit, and waveform 308 shows a practical, bandwidth limited, output of a practical sample and hold circuit. Arrow 312 indicates the settling time, which is equal to a full sample period, thus, the bandwidth of the circuit is approximately equal to one divided by the sample rate. Therefore, the bandwidth requirements for a sample and hold circuit are one-half the bandwidth requirements for a track and hold circuit.

Figure 4:
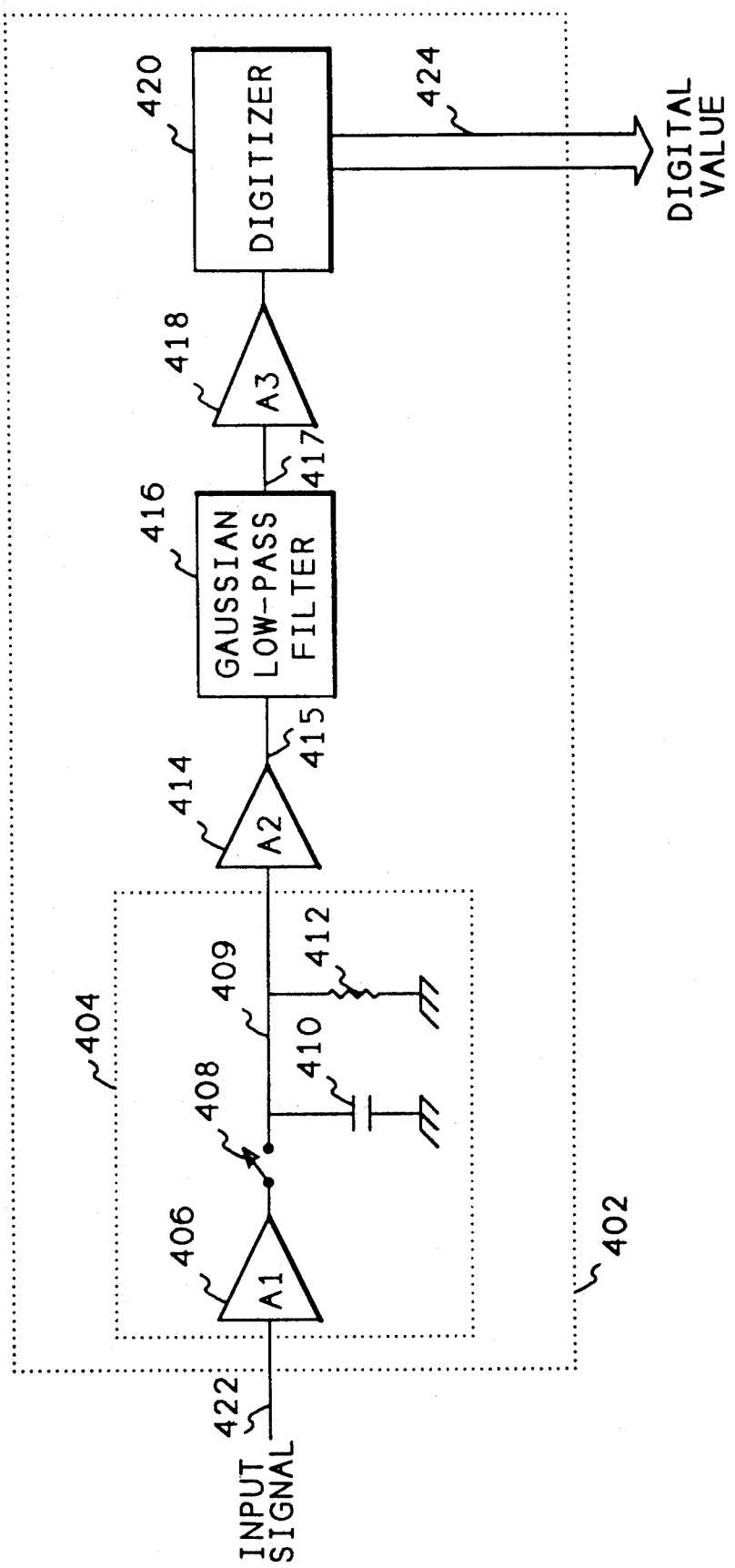
FIG. 4 shows a block diagram of the present invention.

FIG. 4 shows a block diagram of the analog-to-digital converter system of the present invention. Referring now to FIG. 4, the analog-to-digital converter system 402 contains an amplifier 406 which has an input line 422. The output of the amplifier 406 is connected to a sampler 408, illustrated here by a switch. The output of the switch 408 is connected to a capacitor 410 which has a parallel resistor 412. The output of the capacitor-resistor network 410, 412 is connected to a second amplifier 414. The output of the amplifier 414 is connected to a Gaussian low-pass filter 416. The output of the low-pass filter 416 is amplified by amplifier 418 and connected to a digitizer 420 which converts the signal to a digital value which is available on the bus 424. As will be shown below, the amplifier 406, sampling switch 408, capacitor 410, and resistor 412 may be combined into a single circuit.

Figure 5:
FIG. 5 shows a sampled signal current waveform which is output by the sampler of FIG. 4.
Figure 6:
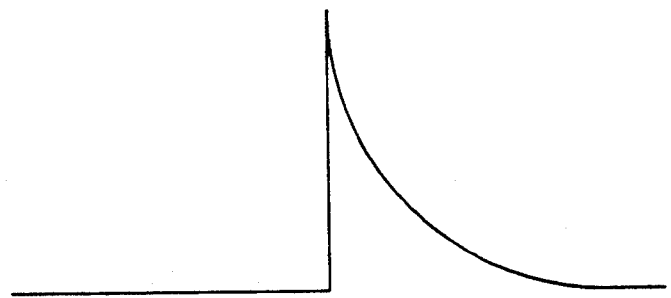
FIG. 6 shows a discharge signal voltage waveform which is output by the capacitor-resistor circuit of FIG. 4.
Figure 7:
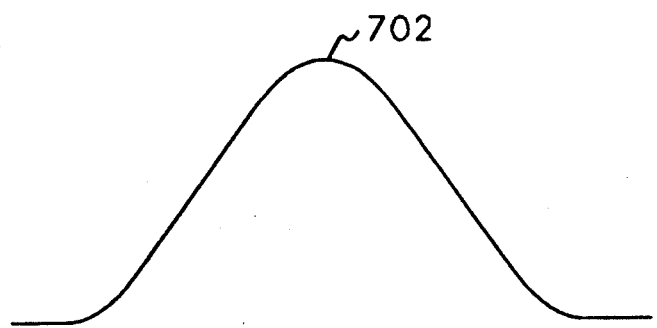
FIG. 7 shows a filtered signal voltage waveform which is output by the Gaussian filter of FIG. 4.

The waveforms of FIGS. 5 through 7 are illustrative of the circuit of FIG. 4, and will be used to explain its operation. Referring now to FIGS. 4 through 7, when an input signal is applied to input 422, and sampling switch 408 samples the input signal, the waveform of FIG. 5 illustrates the current output at location 409 of the sample switch 408. The current waveform of FIG. 5 charges capacitor 410, although not necessarily to the full value of the input signal. When sample switch 408 is opened, the charge on capacitor 410 discharges through resistor 412. The voltage waveform of the capacitor-resistor network 410, 412 is amplified by amplifier 414 and results in the waveform shown in FIG. 6. This waveform is a voltage waveform taken at location 415 of FIG. 4. The discharge rate of the capacitor 410, as illustrated by the waveform of FIG. 6, is shorter than the sampling period. Therefore, capacitor 410 is not used to hold the sampled input signal, and in fact, capacitor 410 does not charge to the full value of the input signal available at 422. Because the charge on the capacitor 410 is not being held, amplifier 414 can be a bipolar transistor amplifier having a low input impedance.

After the signal of FIG. 6 is passed through the Gaussian low-pass filter 416, the waveform appears as shown in FIG. 7. Digitizer 420 then digitizes the value of the signal illustrated by FIG. 7 when the signal is at its peak 702. At peak 702 the slew rate is minimum, thus allowing for maximum A/D converter accuracy. The main constraint of filter 416 is that it must produce an output that can settle from its peak value back to the baseline in one sample period, so as not to interfere with the next sample. The bandwidth requirement of the circuit of FIG. 4 is approximately one-fourth the required bandwidth of a track and hold system and one-half the bandwidth of a sample and hold system that would perform the same function. Thus, the reduced bandwidth allows more noise to be filtered out, and produces less intersymbol interference.

Figure 8:
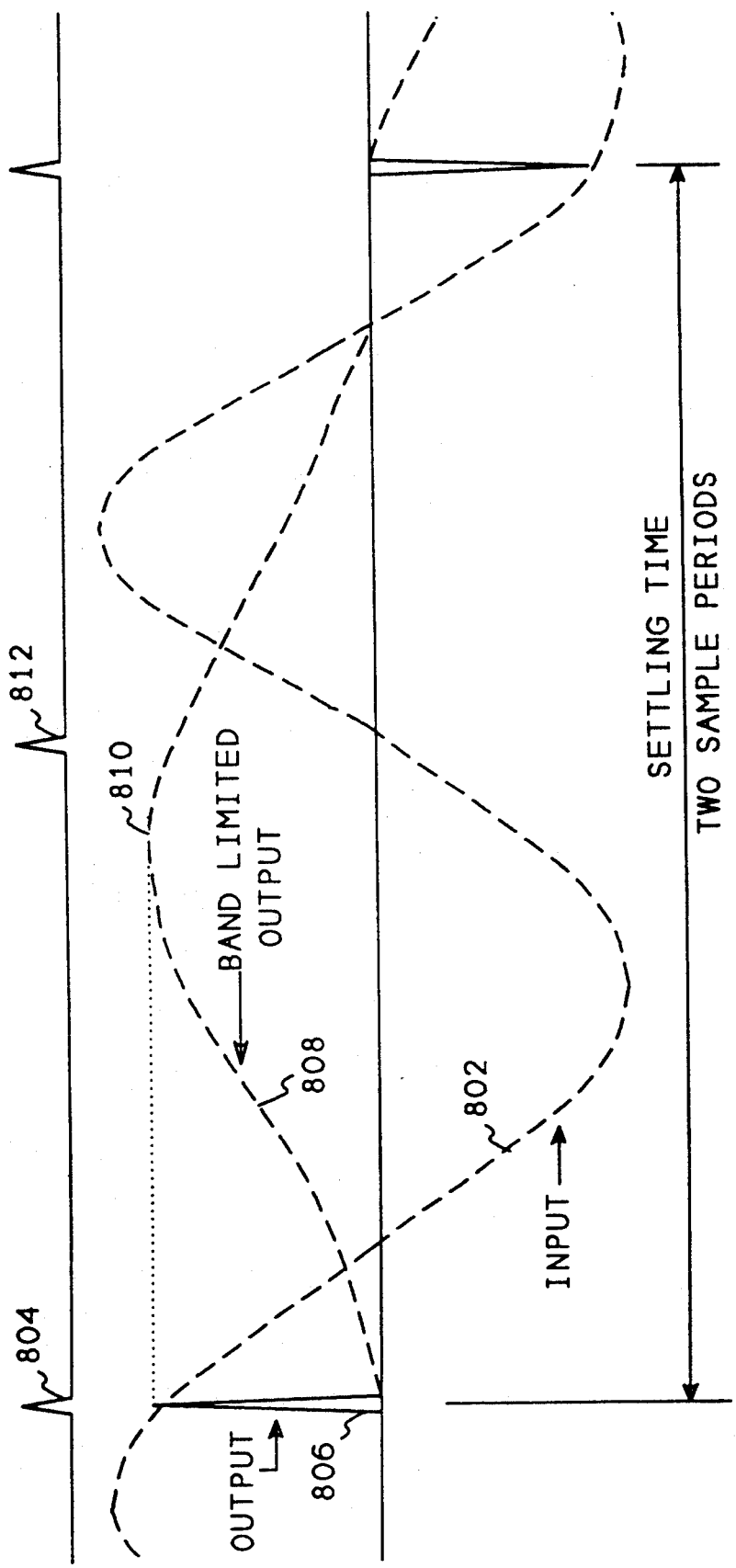
FIG. 8 shows waveforms from the sample and filter circuit of FIG. 4.

FIG. 8 shows a waveform diagram similar to FIGS. 2 and 3, however, the waveforms in FIG. 8 are illustrative for the circuit of the present invention. Referring now to FIG. 8, an input sinusoidal waveform 802 is sampled by a sample pulse 804 which would result in the theoretical output 806, if the following circuits had infinite bandwidth. The circuit of the present invention, however, is bandwidth limited by the Gaussian filter, and results in the output 808. Because of the bandwidth limitation, the output signal 808 peaks at location 810 just prior to the following sample pulse 812. Thus, the circuit and method of the present invention allow the output to peak in one sample time and settle in a subsequent sample time for a total settling time of 2 sample periods. This is contrasted to a sample and hold circuit which has a settling time of one period and a track and hold circuit which has a settling time of one-half of a period. Therefore, the bandwidth requirements of the circuit of the present invention are one-half the bandwidth requirements of a sample and hold circuit and one-fourth the bandwidth requirements of a track and hold circuit.

Figure 9:
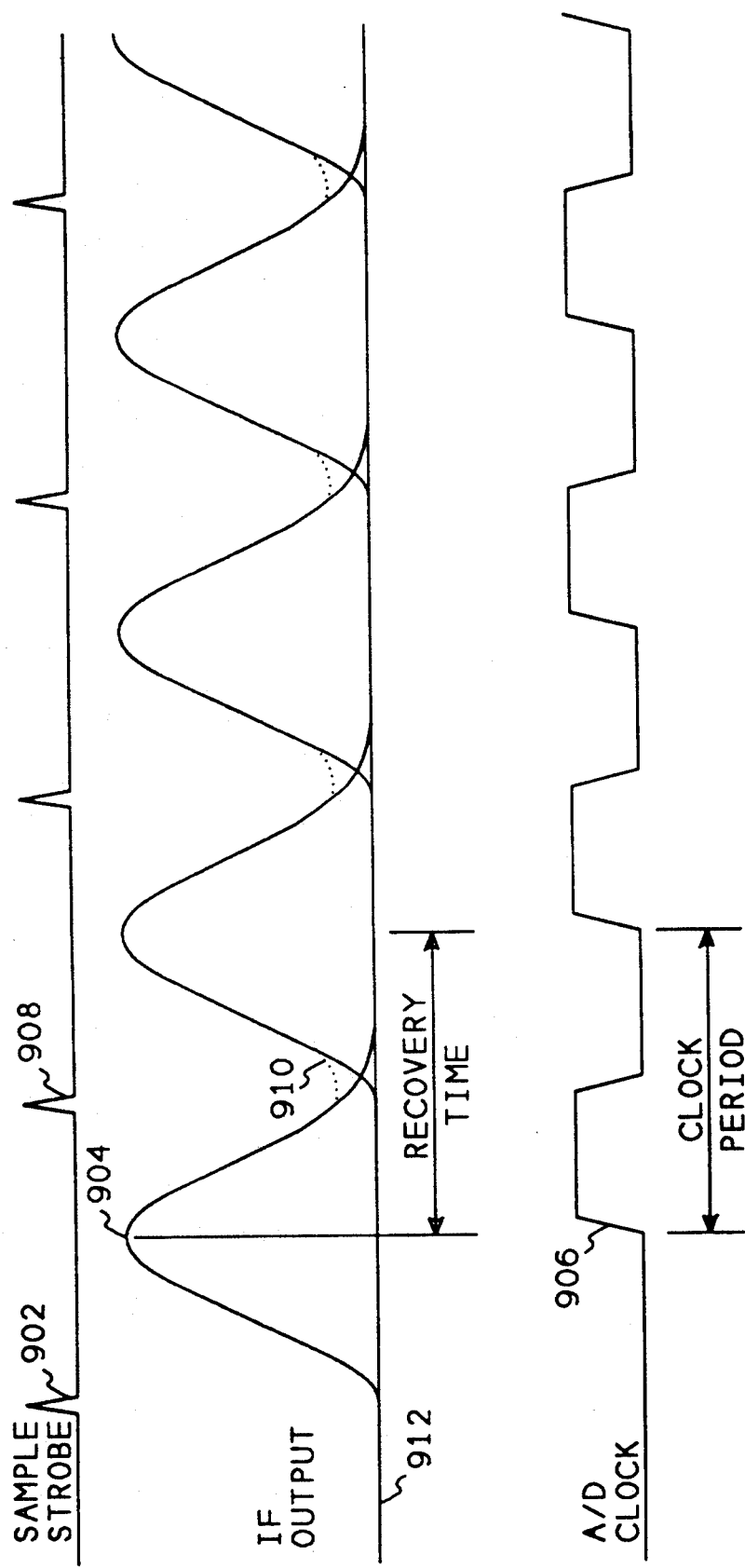
FIG. 9 shows waveforms from the circuit of FIG. 4 and illustrates the settling time requirements.

FIG. 9 shows waveforms from the circuit of FIG. 4 with multiple sample periods being illustrated. Referring now to FIG. 9, an input signal is sampled by a strobe 902 and reaches a peak 904 at which time the A/D clock samples the signal at 906. The Gaussian filter output then begins to settle and does not go all the way to zero prior to the next sample strobe 908, as illustrated by the dashed line 910. It is not necessary for the IF output signal to settle back to the baseline 912. The only requirement is that the IF signal reach another peak at the time of the next A/D clock rise time.

Figure 10:
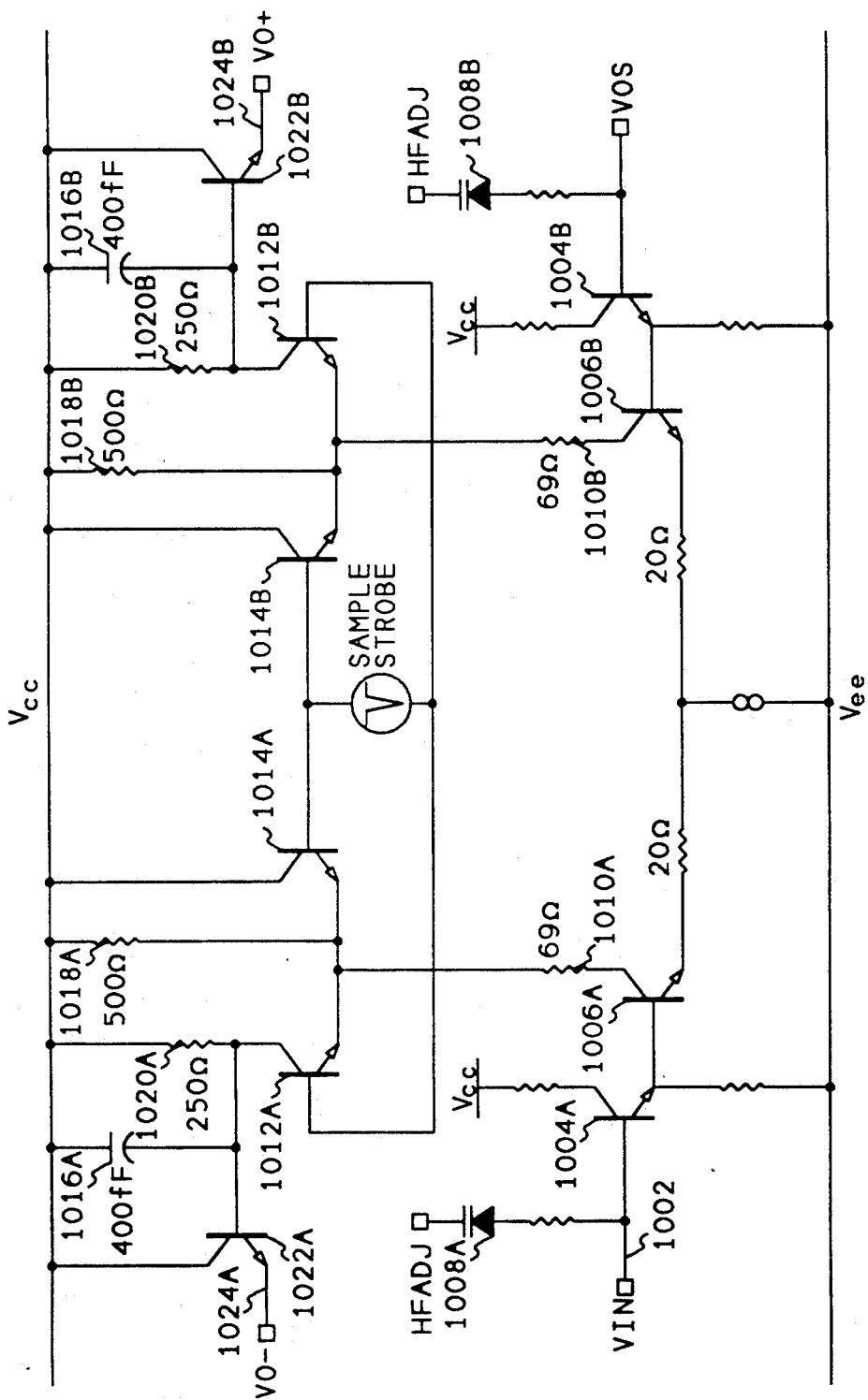
FIG. 10 shows an example of a sampling circuit suitable for use with the present invention.

FIG. 10 shows an example of a preferred implementation of a sampling circuit suitable for use with the present invention. FIG. 10 is by way of example only, since other sampling circuits could be used with the present invention. The circuit of FIG. 10 represents the components illustrated by dashed line 404 in FIG. 4. Referring now to FIG. 10, a differential stage is used to convert the signal from a single ended voltage into a differential current. Emitter followers 1004A, 1004B, and differential amplifier pair 1006A, and 1006B raise the input impedance and maximize the bandwidth. Varactor diodes 1008A and 1008B adjust the peaking of the circuit in interaction with the input bond wires to the integrated circuit on which it is formed. Sixty-nine Ohm (69Ω) resistors 1010A and 1010B at the output of the differential stage thermally balance the circuit, such that signal induced power changes in the transistors do not modulate the base emitter voltages and cause poor settling in the step response. Emitter coupled current switches 1012A, 1012B, 1014A, and 1014B sample the signal current into the 400fF sampling capacitors 1016A and 1016B. The pass transistors 1012A and 1012B are normally turned off while the bypass transistors 1014A and 1014B are normally turned on. When a sample is taken, the pass transistors 1012A and 1012B are turned on for approximately 150 pico-seconds while the bypass transistors 1014A and 1014B are turned off. The current at the output of the differential amplifier is allowed to flow briefly to the collectors of the pass transistors 1012A and 1012B, and into the sampling capacitors 1016A and 1016B. Note that the current being sampled contains the common mode bias current of the differential amplifier. The two 500 Ohm resistors 1018A and 1018B reduce the amount of common mode current arriving at the output. The 250 Ohm resistors 1020A and 1020B in parallel with the sampling capacitors 1016A and 1016B will discharge the capacitors quickly enough so that no charge is left on the capacitors when the next sample is taken. The exponential voltage waveform on the sampling capacitors 1016A and 1016B is buffered and delivered to the outputs 1024A and 1024B through emitter followers 1022A and 1022B.

Although the circuit of FIG. 4 illustrates single-ended amplifiers, it is well known in the art that a differential amplifier can be used in place of a single-ended amplifier.

Figure 11:
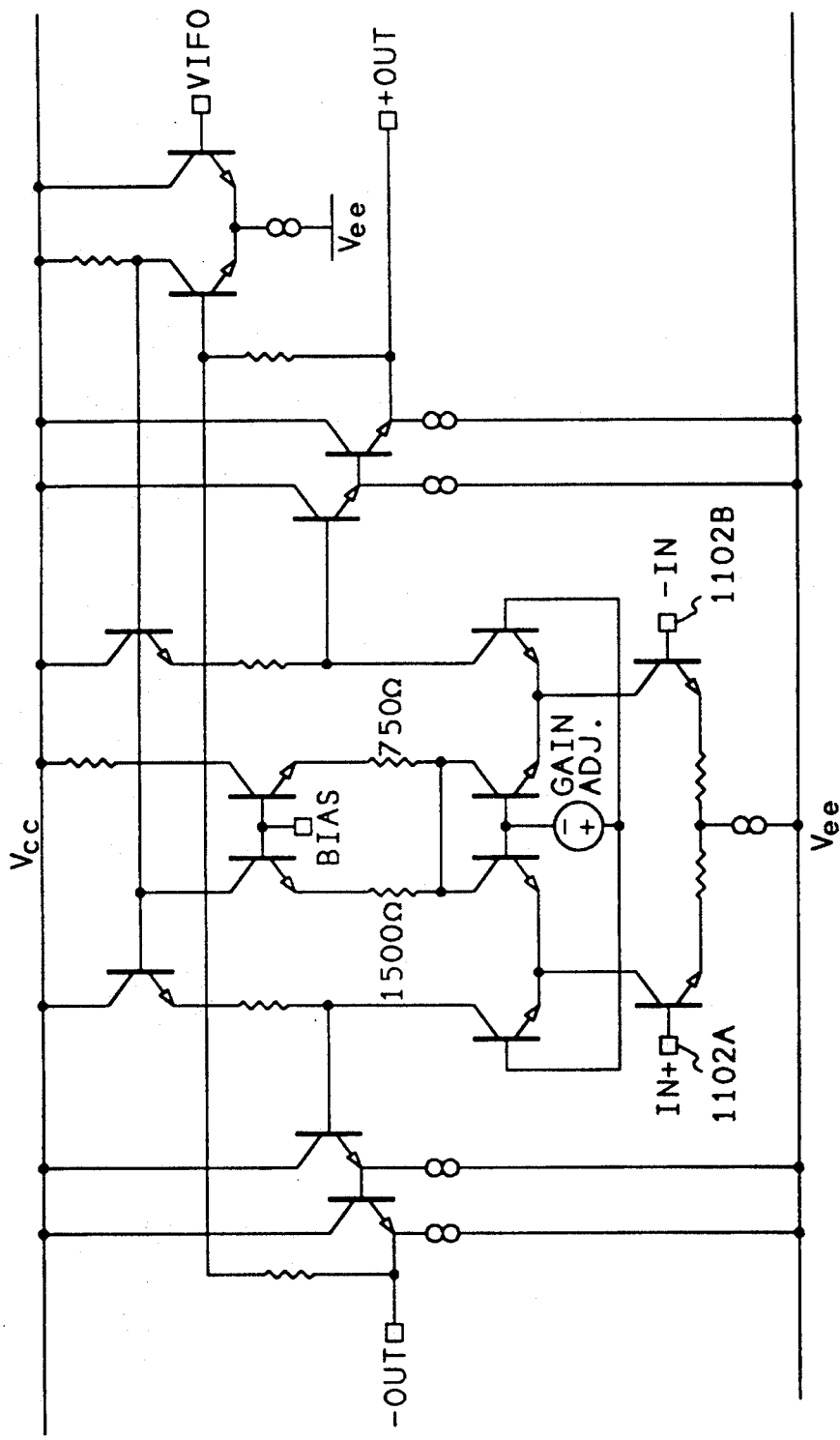
FIG. 11 shows an example of an amplifier suitable for use with the present invention.

FIG. 11 shows an example of a preferred implementation of an amplifier suitable for use with the present invention. FIG. 11 is by way of example only, since many amplifiers could be used with the invention. Referring now to FIG. 6, the input signals 1102A and 1102B are connected to a differential amplifier. Gain is adjusted in the circuit using an emitter coupled vernier circuit. Common mode feedforward and feedback are used to further improve symmetry and settling time of the output. The gain of the amplifier shown in FIG. 11 is variable from approximately 1.5 to approximately 3.0, and the bandwidth is approximately 1.5 gigaHertz.

Figure 12:
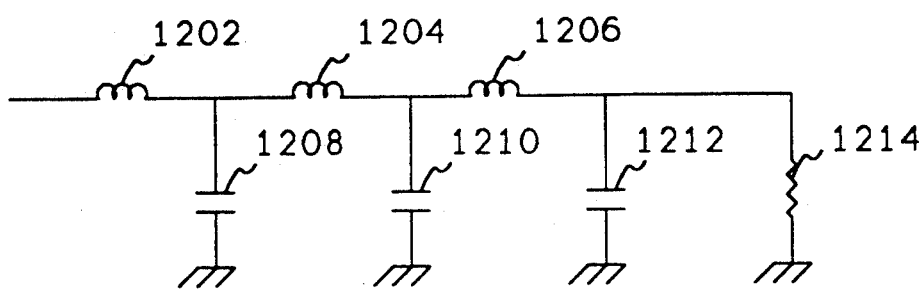
FIG. 12 shows an example of a filter circuit suitable for use with the present invention.

FIG. 12 shows an example of a filter circuit suitable for use with the present invention. Referring now to FIG. 12, inductors 1202, 1204 and 1206 are formed using 76 micron lines and spaces on a thick-film integrated circuit. These are made by first screen printing a field of metal and then etching the pattern. The filter is a sixth order gaussian magnitude ladder network driven from a low impedance and terminated into 65 Ohms. The value for inductors 1202, 1204, and 1206 are approximately 35.8, 16.3, and 7.1 nanoHenrys respectively, the values for capacitors 1208, 1210, and 1212 are approximately 5.3, 2.8, and 0.6 picofarads respectively, and the value of the resistor 1214 is approximately 66 Ohms. A more complete description of Gaussian filters may be found in Zverev, A., *Handbook of Filter Synthesis*, John Wiley & Sons, New York, 1967.

Having thus described a presently preferred embodiment of the present invention, it will now be appreciated that the objects of the invention have been fully achieved, and it will be understood by those skilled in the art that many changes in construction and circuitry and widely differing embodiments and applications of the invention will suggest themselves without departing from the spirit and scope of the present invention. The disclosures and the description herein are intended to be illustrative and are not in any sense limiting of the invention, more preferably defined in scope by the following claims.

I claim:

1. A system for converting an analog signal into a digital value comprising:
    sampling means connected to the analog signal for sampling the analog signal for a predetermined amount of time to provide a sampled analog signal;
    storage means connected to an output of said sampling means for storing said sampled analog signal during said predetermined amount of time;
    discharge means connected to an output of said storage means for removing said sampled analog signal from said storage means at a predetermined rate to provide a discharging signal, wherein said removing occurs during analog to digital conversion;
    low-pass filter means connected to an output of said discharge means for removing high frequency components from said discharging signal to provide a filtered signal; and
    analog to digital conversion means connected to an output of said low-pass filter means for converting said filtered signal to a digital value.

2. The system of claim 1 wherein said analog to digital conversion means converts said filtered signal at a time when said filtered signal is at a peak.

3. The system of claim 1 wherein said low-pass filter has essentially linear phase shift and essentially zero undershoot.

4. The system of claim 3 wherein said low-pass filter means comprises a high order Gaussian magnitude low-pass filter.

5. The system of claim 1 wherein said storage means comprises a capacitor.

6. The system of claim 1 wherein said discharge means comprises a resistor means connected across said storage means.

7. The system of claim 1 further comprising amplifier means connected between said discharge means and said low-pass filter means.

8. The system of claim 1 further comprising amplifier means connected between said low-pass filter means and said analog to digital conversion means.

9. The system of claim 1 wherein said analog to digital conversion means comprises a flash analog to digital converter.

10. A system for converting an analog signal into a digital value comprising:
   sampling means connected to the analog signal for sampling the analog signal for a predetermined amount of time to provide a sampled analog signal;
   capacitor means connected to an output of said sampling means for storing said sampled analog signal during said predetermined amount of time;
   resistor means connected across said capacitor means for removing said sampled analog signal from said capacitor means at a predetermined rate to provide a discharging signal;
   low-pass filter means connected to said resistor means for removing high frequency components from said discharging signal to provide a filtered signal; and
   analog to digital conversion means connected to an output of said low-pass filter means to convert said filtered signal to a digital value.

11. The system of claim 10 wherein said analog to digital conversion means converts said filtered signal at a time when said filtered signal is at a peak.

12. The system of claim 10 wherein said low-pass filter has essentially linear phase shift and essentially zero undershoot.

13. The system of claim 12 wherein said low-pass filter means comprises a high order Gaussian magnitude low-pass filter.

14. The system of claim 10 further comprising amplifier means connected between said discharge means and said low-pass filter means.

15. The system of claim 10 further comprising amplifier means connected between said low-pass filter means and said analog to digital conversion means.

16. The system of claim 10 wherein said analog to digital conversion means comprises a flash analog to digital converter.

17. A method for converting an analog electrical signal into a digital value comprising the steps of:
   (a) sampling the analog electrical signal for a predetermined amount of time to create a sampled signal;
   (b) storing said sampled signal during said sampling;
   (c) discharging said sampled signal at a predetermined rate, wherein said discharging occurs during steps (d) and (e);
   (d) filtering said sampled signal during said discharging to create a filtered signal; and
   (e) converting said filtered signal to a digital value.

18. The method of claim 17 wherein step (e) converts said filtered signal at a time when said filtered signal is at a peak.

19. The method of claim 17 wherein step (d) filters said sampled signal with a filter having essentially zero phase shift and essentially zero undershoot.

20. The method of claim 17 wherein step (d) filters said sampled signal with a high order Gaussian magnitude low-pass filter.

21. The method of claim 17 wherein step (d) further comprises the step of amplifying said sampled signal prior to filtering said signal.

22. The method of claim 17 wherein step (e) further comprises the step of amplifying said filtered signal prior to said conversion.

* * * * *